United States Patent
Lin et al.

(10) Patent No.: US 8,717,763 B2
(45) Date of Patent: May 6, 2014

(54) COOLING SYSTEM FOR ELECTRONIC DEVICE AND ELECTRONIC DEVICE HAVING SAME

(75) Inventors: Tai-Wei Lin, New Taipei (TW); Chin-Hui Chen, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 143 days.

(21) Appl. No.: 13/439,865

(22) Filed: Apr. 5, 2012

(65) Prior Publication Data

US 2013/0155614 A1    Jun. 20, 2013

(51) Int. Cl.
*H05K 7/20* (2006.01)
*F24F 7/06* (2006.01)

(52) U.S. Cl.
USPC .......... 361/695; 361/679.48; 361/679.49; 361/679.5; 361/679.51; 361/691; 361/692; 361/694; 165/80.3; 165/104.33; 165/121; 165/122; 454/184

(58) Field of Classification Search
USPC .............. 361/679.46–679.54, 690–697, 361/717–727; 165/80.2, 80.3, 104.33, 165/121–126, 185; 454/184, 338; 174/15.1, 174/15.2, 16.1, 16.3
See application file for complete search history.

(56) References Cited

U.S. PATENT DOCUMENTS

| | | | |
|---|---|---|---|
| 6,504,718 B2 * | 1/2003 | Wu | 361/695 |
| 7,342,786 B2 * | 3/2008 | Malone et al. | 361/695 |
| 7,391,618 B2 * | 6/2008 | Fujiya et al. | 361/727 |
| 7,408,773 B2 * | 8/2008 | Wobig et al. | 361/695 |
| 8,077,458 B2 * | 12/2011 | Guan | 361/695 |
| 8,405,987 B2 * | 3/2013 | Lai | 361/695 |
| 2008/0117589 A1 * | 5/2008 | Carrera et al. | 361/687 |

* cited by examiner

*Primary Examiner* — Michail V Datskovskiy
(74) *Attorney, Agent, or Firm* — Novak Druce Connolly Bove + Quigg LLP

(57) ABSTRACT

A cooling system includes a first group of fans, a second group of fans, and an air conducting cover. The air conducting cover includes a first partition, a second partition, a third partition. The first partition is connected between the second partition and the third partition to define a first space, a second space and a third space. Wherein the first group of fans directs air flow to enter the first space and the second space, the second group of fans directs air flow to enter the third space.

6 Claims, 3 Drawing Sheets

COOLING SYSTEM FOR ELECTRONIC DEVICE AND ELECTRONIC DEVICE HAVING SAME

BACKGROUND

1. Technical Field

The disclosure generally relates to cooling systems for electronic devices.

2. Description of Related Art

Many electronic components in an electronic device generate heat when operating. In designing an electronic device, cooling systems are used to dissipate heat generated by the electronic components to prevent the electronic components from overheating.

Many cooling systems include a group of fans. The fans are configured to force air to flow past the electronic components which are cooled accordingly. However, when there are more electronic components in the electronic device, the fans cannot uniformly direct the airflow to each electronic component for dissipating heat.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary cooling system and electronic device having the cooling system. Moreover, in the drawings, like reference numerals designate corresponding parts throughout the several views. Wherever possible, the same reference numbers are used throughout the drawings to refer to the same or like elements of an embodiment.

DETAILED DESCRIPTION

Figure 1:
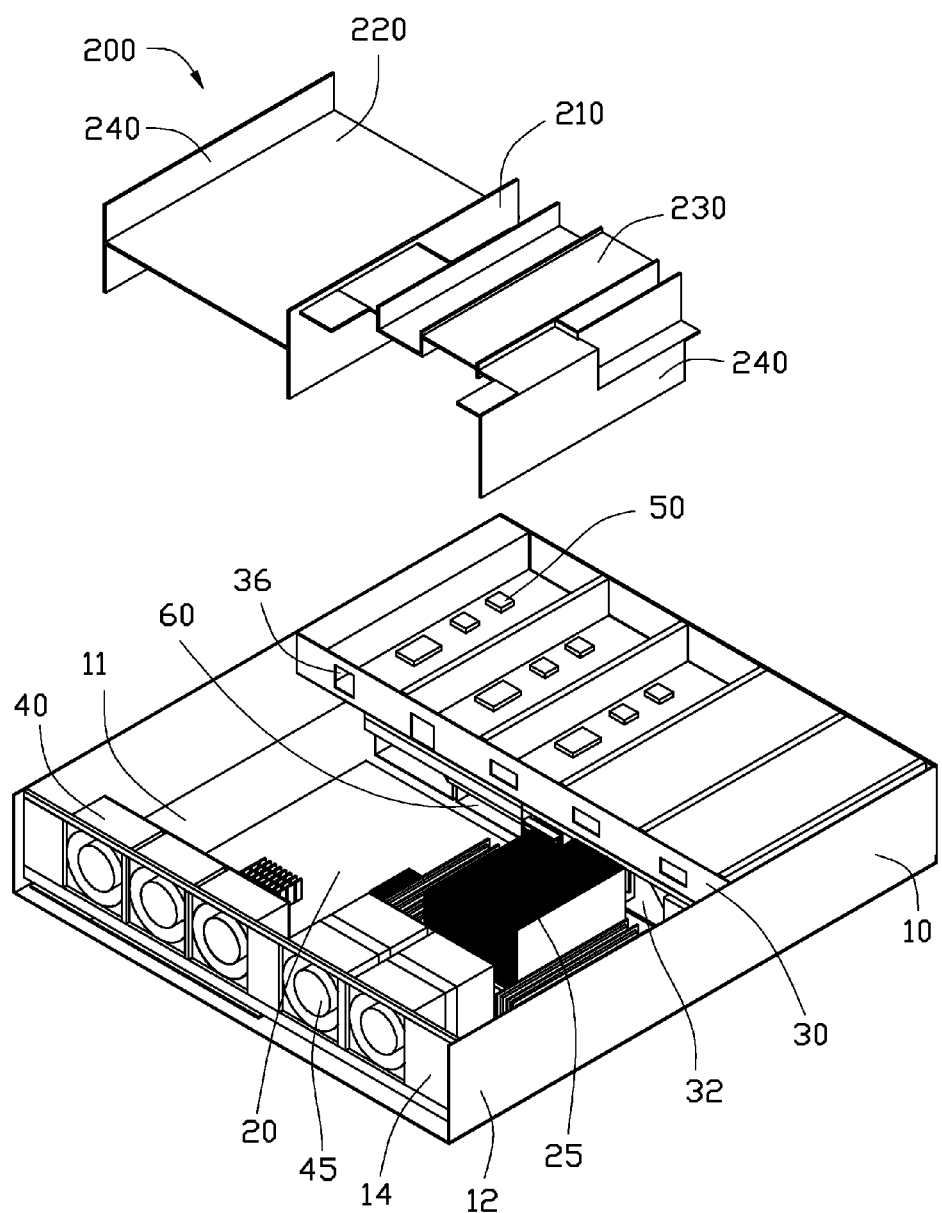
FIG. 1 is a partially exploded view of an embodiment of an electronic device including a cooling system.
Figure 2:
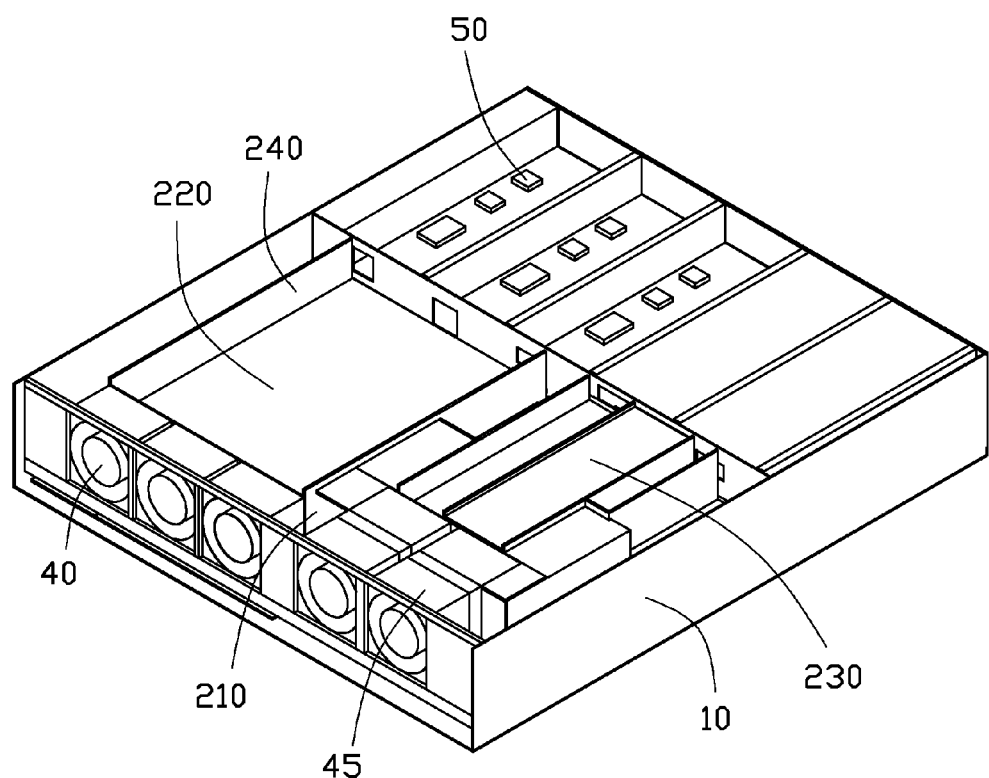
FIG. 2 is a schematic view of the assembled electronic device including the cooling system in FIG. 1.

Referring to FIGS. 1 and 2, an electronic device 100 includes a chassis 10, a motherboard 20, a first electronic component 25, a division board 30, a first group of fans 40, a second group of fans 45, a second electronic component 50, a third electronic component 60, and an air conducting cover 200.

In the exemplary embodiment, the first electronic component 25 is a group of expansion boards, disposed on the motherboard 20. The second electronic component 50 is a subscriber line interface circuit (SLIC) module, and the third electronic component 60 is a power supply. The division board 30, the first and second groups of fans 40, 45, and the air conducting cover 200 constituting a cooling system for dissipating heat generated by the electronic components 25, 50, 60 to prevent the electronic components from overheating.

The chassis 10 includes a base plate 11, two opposite sidewalls 12, and two opposite end walls 14 connecting the sidewalls 12. The sidewalls 12 and the ends walls 14 are substantially perpendicularly connected to edges of the base plate 11. The motherboard 20 is mounted on the base plate 11. The division board 30 is substantially perpendicularly connected to the base plate 11, and isolates the second electronic component 50 with the first electronic component 25 and the third electronic component 60. The division board 30 defines a ventilation hole 32 and a number of airflow channels 36.

The first group of fans 40 is made of three fans arranged along a line. The first group of fans 40 faces to the third electronic component 60. The second group of fans 45 is made of four fans arranged along two columns and two rows (two by two matrix). The second group of fans 45 is opposite to the first electronic component 25.

The air conducting cover 200 is positioned at one side of the division board 30 for covering the first electronic component 25 and the third electronic component 60. The air conducting cover 200 includes a first partition 210, a second partition 220, a third partition 230, and two end plates 240. The first partition 210 is perpendicularly connected between the second partition 220 and the third partition 230. One of the end plates 240 is substantially perpendicularly connected to one end of the second partition 220, and the other of the end plates 240 is substantially perpendicularly connected to one end of the third partition 210.

The second partition 220 is positioned between the first group of fans 40 and the division board 30 to defines a first space 250 and a second space 260. Air flowing in the second space 260 can pass through the airflow channels 36 to dissipate the heat generated by the second electronic component 50.

The third partition 230 is substantially stepped configured for covering the first electronic component 25. The third partition 230 with the first partition 210 defines a third space 270 to allow the second group of fans 45 to dissipate heat generated by the first electronic component 25. The heated airflow passing through the first electronic component 25 may go out from the ventilation hole 32 of the division board 30.

Figure 3:
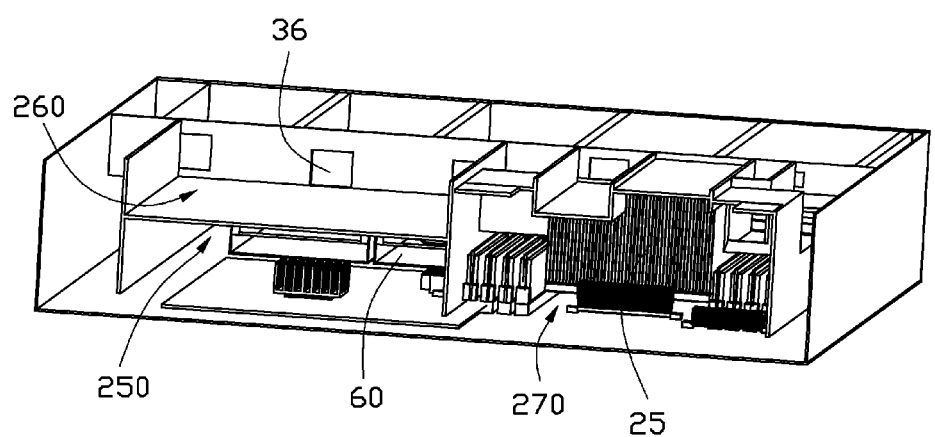
FIG. 3 is a cross-sectional view of the electronic device in FIG. 2.

In use, referring to FIG. 3, when the first group of fans 40 and the second group of fans 45 are operating, the second partition 220 directs airflow of the first group of fans 40 to respectively enter the first space 250 and the second space 260. The third partition 230 directs airflow of the second group of fans 45 to enter the third space 270 for dissipating heat generated by the first electronic component 25. The airflow in the second space 260 further passes through the airflow channels 36 to be directed to the electronic components 50 for dissipating heat.

The heated airflow passing through the first electronic component 25 goes out from the ventilation hole 32 of the division board 30, thus, the first partition 210 can prevent the heated airflow from passing through the second electronic component 50 and the third electronic component 60. Additionally, the airflow of the first group of fans 40 can be partially directed to the second electronic component 50 for dissipating heat. Thus, the airflow of the first group of fans 40 can be effectively distributed to dissipate.

It is to be understood, however, that even through numerous characteristics and advantages of the disclosure have been set forth in the foregoing description, together with details of the system and function of the disclosure, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A cooling system, comprising:
    a first group of fans;
    a second group of fans;
    a division board; and
    an air conducting cover including a first partition, a second partition, a third partition, the first partition connected to and between the second partition and the third partition to define a first space, a second space and a third space;

wherein the first group of fans directs airflow to enter the first space and the second space, the second group of fans directs airflow to enter the third space.

2. The cooling system as claimed in claim 1, wherein the air conducting cover further includes two ends plates, one of the end plates is perpendicularly connected to one end of the second partition, and the other of the end plates is perpendicularly connected to one end of the third partition.

3. The cooling system as claimed in claim 2, wherein the third partition is substantially stepped, and faces the second group of fans.

4. An electronic device, comprising:
a chassis,
a division board;
a first group of fans;
a second group of fans; and
an air conducting cover including a first partition, a second partition, a third partition, the first partition connected between the second partition and the third partition to define a first space, a second space and a third space;

wherein the first group of fans directs airflow to enter the first space and the second space, the second group of fans directs air flow to enter the third space.

5. The electronic device as claimed in claim 4, wherein the division board defines a number of airflow channels, the air flow in the first space further passes through the airflow channels to be directed to another side of the division board.

6. The electronic device as claimed in claim 4, wherein the chassis includes a base plate, two opposite sidewalls, and two opposite end walls connecting the sidewalls, the sidewalls and the ends walls are perpendicularly connected to edges of the base plate.

* * * * *